(12) United States Patent
Hoashi et al.

(10) Patent No.: US 8,384,202 B2
(45) Date of Patent: Feb. 26, 2013

(54) SEMICONDUCTOR DEVICE, AND COMMUNICATION APPARATUS AND ELECTRONIC APPARATUS HAVING THE SAME

(75) Inventors: Yukihiko Hoashi, Fukuoka (JP); Hiroo Kubo, Fukuoka (JP); Kazuhito Tsuzura, Fukuoka (JP); Kunihiko Shiroishi, Fukuoka (JP)

(73) Assignee: Yoshikawa Kogyo Co., Ltd., Fukuoka (JP)

( * ) Notice: Subject to any disclaimer, the term of this patent is extended or adjusted under 35 U.S.C. 154(b) by 155 days.

(21) Appl. No.: 12/920,632

(22) PCT Filed: Mar. 10, 2009

(86) PCT No.: PCT/JP2009/054476
§ 371 (c)(1),
(2), (4) Date: Nov. 23, 2010

(87) PCT Pub. No.: WO2009/113507
PCT Pub. Date: Sep. 17, 2009

(65) Prior Publication Data
US 2011/0133296 A1      Jun. 9, 2011

(30) Foreign Application Priority Data
Mar. 10, 2008 (JP) ................................. 2008-059713

(51) Int. Cl.
*H01L 23/02* (2006.01)
(52) U.S. Cl. ........ 257/686; 257/678; 257/690; 438/106; 438/109; 438/123
(58) Field of Classification Search .......... 257/676–715, 257/E23.031, E29.324; 438/106–127
See application file for complete search history.

(56) References Cited

U.S. PATENT DOCUMENTS

| 6,917,142 B2 | 7/2005 | Koyama et al. |
| 2004/0135474 A1 | 7/2004 | Koyama et al. |

FOREIGN PATENT DOCUMENTS

| JP | 11233683 A | 8/1999 |
| JP | 2003303920 A | 10/2003 |
| JP | 2004-166230 A | 6/2004 |
| JP | 2005260270 A | 9/2005 |
| JP | 2006352349 | 12/2006 |

OTHER PUBLICATIONS

International Search Report published Sep. 17, 2009 for PCT/JP2009/054476 filed Mar. 10, 2009.

*Primary Examiner* — Telly Green
(74) *Attorney, Agent, or Firm* — Marty Fleit; Paul D. Bianco; Fleit Gibbons Gutman Bongini Bianco PL (57) ABSTRACT

Provided is a package structure of a semiconductor device, capable of further reducing a planar size. The semiconductor device comprises a first package 2 embedding a first element 1, and a second package 4 stacked on and fixed to the first package while internally housing a second element 3. The first package 2 includes a lead frame 5 and a metallization wiring 6. The metallization wiring 6 is formed by resin-molding the first package 2 using a transfer lead frame having the metallization wiring 6 arranged on a base substrate, and, after the resin molding, removing the base substrate to leave the metallization wiring 6 on a removing surface of a molded resin in a transferred manner, while allowing a peripheral region of the metallization wiring 6 to be exposed on the side of and in flush relation with the removing surface of the molded resin so as to serve as an external terminal 6*a*. The first element 1 is mounted on the external terminal 6*a* of the metallization wiring 6 in at least partially overlapped relation therewith, through an insulator layer 8, and electrically connected to the lead frame 5 and the metallization wiring 6.

20 Claims, 4 Drawing Sheets

SEMICONDUCTOR DEVICE, AND COMMUNICATION APPARATUS AND ELECTRONIC APPARATUS HAVING THE SAME

TECHNICAL FIELD

The present invention relates to a semiconductor device formed by stacking two packages, and more particularly to a package structure of the semiconductor device.

BACKGROUND ART

The following description will be made by taking a piezoelectric oscillator as an example of such a semiconductor device formed by stacking two packages. Due to rapid progress in price-reduction and miniaturization of mobile communication apparatuses, such as a mobile phone, along with the popularization thereof, miniaturization and thinning are also increasingly expected in piezoelectric oscillators, such as a crystal oscillator, for use in the communication apparatuses Heretofore, as a structure of a piezoelectric oscillator, there has been known a type which comprises a first package embedding a circuit element for making up an oscillator circuit, and a second package stacked on and fixed to the first package while internally housing a piezoelectric vibrator element, as disclosed in the following Patent Document 1. In the Patent Document 1, it is intended to achieve miniaturization of a piezoelectric oscillator in such a manner that a lead frame for electrically connecting the first package and a mounting board to which the piezoelectric oscillator is mounted, and a lead frame for electrically connecting the first frame and the second frame, are formed as separate lead frames, and the separate lead frames are arranged to allow respective positions thereof in a vertical direction to overlap each other.

However, along with the popularization of mobile phones, the needs for miniaturization and thinning of communication apparatuses and electronic apparatuses are increasingly growing, and thereby the technique of simply stacking two lead frames as disclosed in the Patent Document 1 can no longer respond to the needs. Specifically, in the technique of the Patent Document 1, due to the vertically overlapped arrangement, the lead frames are located closely to cause difficulty in smooth wiring, so that there is a limit to narrowing a pitch between the lead frames for miniaturization and thinning. Moreover, if a thickness of the lead frame is reduced with a view to miniaturization and thinning, strength of the lead frame will be lowered, which causes problems, such as deformation of the lead frame due to handling during assembling, or impossibility of handling in some cases.

On the other hand, the applicant of this application disclosed a package structure of a piezoelectric oscillator, using a transfer lead frame, in the following Patent Document 2. In the package structure, a metallization wiring is formed by resin-molding a package using a transfer lead frame having the metallization wiring arranged on a base substrate, and, after the resin molding, remove the base substrate of the transfer lead frame to leave only the metallization wiring on a removing surface of a molded resin in a transferred manner, while allowing a peripheral region of the metallization wiring to be exposed on the side of in flush relation with the removing surface of the molded resin so as to serve as an external terminal. This makes it possible to further reduce a thickness to facilitate miniaturization and thinning, as compared with the structure where a plurality of lead frames is arranged in vertically overlapped relation in a single package.

However, the package structure using the transfer lead frame also has limitations in miniaturization and thinning, particularly, a reduction in planar size (length×width). Specifically, an attempt to reduce a planar size of a package causes a need for avoiding short-circuiting between a circuit element and an external terminal of a metallization wiring. Thus, there is no other choice but to reduce a planar size of the external terminal of the metallization wiring so as to prevent interference therebetween. However, if the planar size of the external terminal of the metallization wiring is excessively reduced, it becomes impossible to obtain a desired mounting strength. Therefore, due to a restriction for ensuring the desired mounting strength, there is a limit to a reduction in planar size of a package.

[Patent Document 1] JP 2004-166230A
[Patent Document 2] JP 3947545B

DISCLOSURE OF THE INVENTION

Problem to be Solved by the Invention

It is an object of the present invention to provide a package structure of a semiconductor device such as a piezoelectric oscillator, which is capable of further reducing a planar size.
Means for Solving the Problem The present invention provide a semiconductor device which comprises a first package embedding a first element, and a second package stacked on and fixed to the first package while internally housing a second element. In the semiconductor device, the first package includes a lead frame and a metallization wiring. A certain end of the lead frame is formed as a first external terminal exposed in flush relation with an outer surface of the first package, and the metallization wiring is formed by resin-molding the first package using a transfer lead frame having the metallization wiring arranged on a base substrate, and, after the resin molding, removing the base substrate to leave the metallization wiring on a removing surface of a molded resin in a transferred manner, while allowing a peripheral region of the metallization wiring to be exposed on the side of and in flush relation with the removing surface of the molded resin so as to serve as a second external terminal. Further, the first element is mounted on the second external terminal of the metallization wiring in at least partially overlapped relation therewith, through an insulator layer, and electrically connected to the lead frame and the metallization wiring. One of the first and second external terminals is exposed on one of upper and lower surfaces of the first package to serve as a mounting terminal, and a remaining one of the first and second external terminals is exposed on a remaining one of the upper and lower surfaces and electrically connected to an external terminal of the second package.

In the present invention, the transfer lead frame is used as with the Patent Document 1, so that miniaturization and thinning of the packages of the semiconductor can be achieved. In addition, the first element is mounted on the on the second external terminal of the metallization wiring in at least partially overlapped relation therewith, through the insulator layer, so that a planar size of the package can be reduced without reducing a planar size of the second external terminal of the metallization wiring. This means that the planar size of the package can be reduced without deterioration in mounting strength based on the second external terminal of the metallization wiring. Further, the insulator layer is interposed between the first element and the second external terminal of the metallization wiring, so that a risk of short-circuiting therebetween is eliminated.

In the present invention, an island portion for mounting the first element may be provided in a central region of the metallization wiring of the transfer lead frame. In this case, the first element is mounted on the second external terminal of the metallization wiring in at least partially overlapped relation therewith and on the island portion in at least partially overlapped relation therewith, through the insulator layer.

By providing the island portion as abovementioned, heat of the first element can be efficiently released via the island portion. In cases where the first element is mounted only on the second external terminal located in the peripheral region of the metallization wiring, and the central region of the metallization wiring is formed as a open space, the space in the central region of the metallization wiring is relatively narrow and thereby resin is less likely to run into the space during molding/sealing with resin to increase a risk of occurrence of a defect in molding. However, when the island portion is provided in the central region of the metallization wiring, a need for molding the central region is eliminated, and thereby the defect in molding of the package becomes less likely to occur.

Preferably, the island portion is provided with a terminal electrically connected to the first element and/or the lead frame. By providing a terminal to the island portion to allow the island portion to be also used as a wire, the planar size of the package can be further reduced.

The first element and the second element may be formed as a circuit element for making up an oscillator circuit, and a piezoelectric vibrator element, respectively. In this case, a small and thin piezoelectric oscillator can be obtained. Further, the semiconductor device of the present invention, such as a piezoelectric oscillator, may be mounted in a communication apparatus or an electronic apparatus so as to facilitate miniaturization and thinning of the apparatus.

Effect of the Invention

In the present invention, by using metallization wiring of a transfer lead frame, and mounting an element onto an external terminal of the metallization wiring in at least partially overlapped relation therewith, through an insulation layer, so that a planar size of a package can be reduced without deterioration in mounting strength based on the external terminal of the metallization wiring.

BEST MODE FOR CARRYING OUT THE INVENTION

The present invention will now be described based on an embodiment thereof, in which the present invention is applied to a piezoelectric oscillator.

Figure 1:
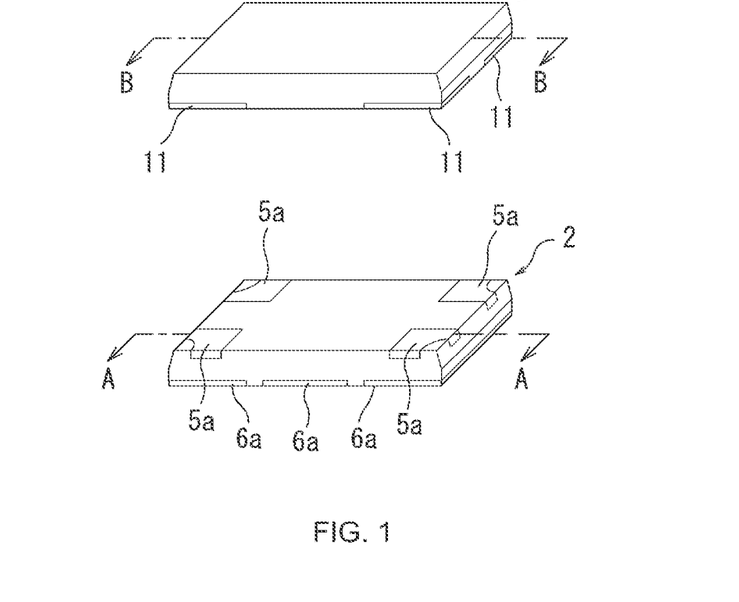
FIG. 1 is an exploded perspective view of a piezoelectric oscillator according to one embodiment of the present invention.
Figure 2:
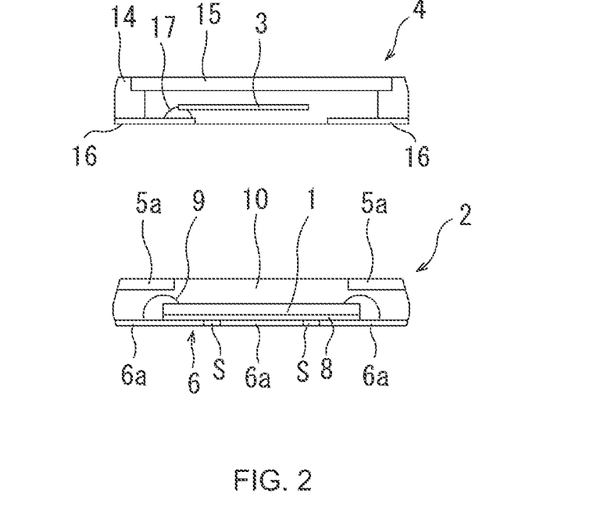
FIG. 2 illustrates cross sections taken along the lines A-A and B-B in FIG. 1.
Figure 3:
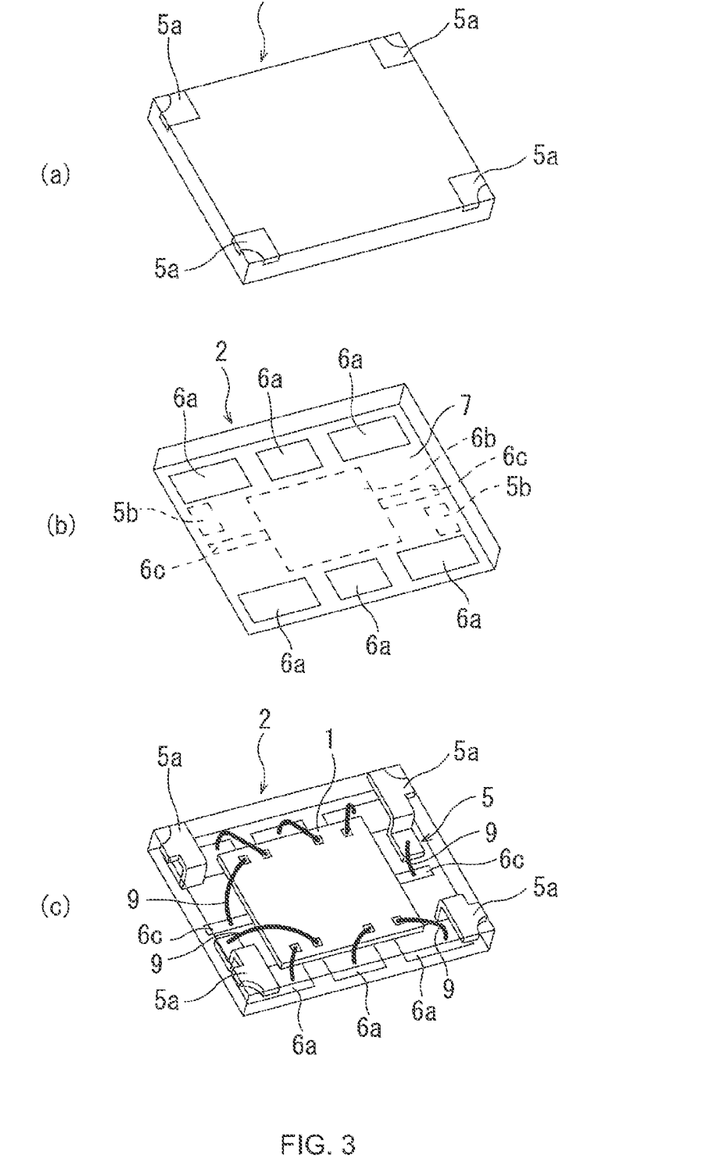

FIG. 1 is an exploded perspective view of a piezoelectric oscillator according to one embodiment of the present invention, and FIG. 2 illustrates two cross sections taken along the lines A-A and B-B in FIG. 1. FIG. 3 is a perspective view of a first package in FIG. 1, wherein FIG. 3(a), FIG. 3(b) and FIG. 3(c) illustrate a portion on the side of a second package, a portion on the side of a mounting surface and an internal structure, respectively.

The piezoelectric oscillator illustrated in FIG. 1 comprises a first package 2 embedding a circuit element (first element) 1 for making up an oscillator circuit, and a second package 4 housing a piezoelectric vibrator element (second element) 3, wherein it is formed by stacking and fixing the second package 4 on/to the first package 2.

As shown in FIGS. 2 and 3, the first package 2 has a lead structure comprising a lead frame 5 and a metallization wiring 6.

In the lead structure, the lead frame 5 is formed to bendingly extend from an inside of the first package 2 in such a manner that one end (first end) thereof is exposed on an upper surface of the first package 2 to serve as an external terminal 5a. Instead of bending the lead frame 5, the lead frame 5 may be subjected to etching to form the external terminal 5a.

The metallization wiring 6 has an external terminal 6a in six areas of a peripheral region thereof, and an island portion 6b in a central region thereof. The island portion 6a is provided with a terminal 6c protruding from each of opposite sides thereof in a lateral direction. In this embodiment, the external terminal 6a of the metallization wiring 6 serves as a mounting terminal for mounting the first package 2 to a mounting board (not shown), and a portion of the first package 2 on the side of the mounting surface, except the external terminal 6a in the six areas, is masked by a masking layer 7 made of an insulator material, to allow only the external terminal 6a to be exposed.

The circuit element 1 is mounted on the external terminal 6a of the metallization wiring 6 in a partially overlapped relation therewith and on the island portion 6b in overlapped relation with the entire surface thereof, through an insulator layer 8. The circuit element 1 is electrically connected to the external terminal 6a by wire bonding 9, so as to make it possible to receive electric power and a control signal from the mounting board via the external terminal 6a. Further, the circuit element 1 is electrically connected to the lead frame 5 directly or via the terminal 6c of the metallization wiring 6, so as to make it possible to receive and transmit a control signal from/to the piezoelectric vibrator element 3 inside the second package 4 via the lead frame 5.

The first package 2 having the above configuration is integrated and packaged by a resin mold 10.

The first package 2 can be produced in the following process

Firstly, an adhesive is applied onto a surface of a base substrate (not shown) made of copper, stainless steel or the like. A transfer lead frame having the conductive metallization wiring 6 arranged on the adhesive-coated surface (i.e., a transfer lead frame having the metallization wiring arranged on the base substrate) is prepared, and the circuit element 1 is mounted on the transfer lead frame. Specifically, the circuit element 1 is mounted on the external terminal 6a of the metallization wiring 6 in partially overlapped relation therewith and on the island portion 6b in overlapped relation with the entire surface thereof, through the insulator layer 8, as mentioned above.

Figure 4:
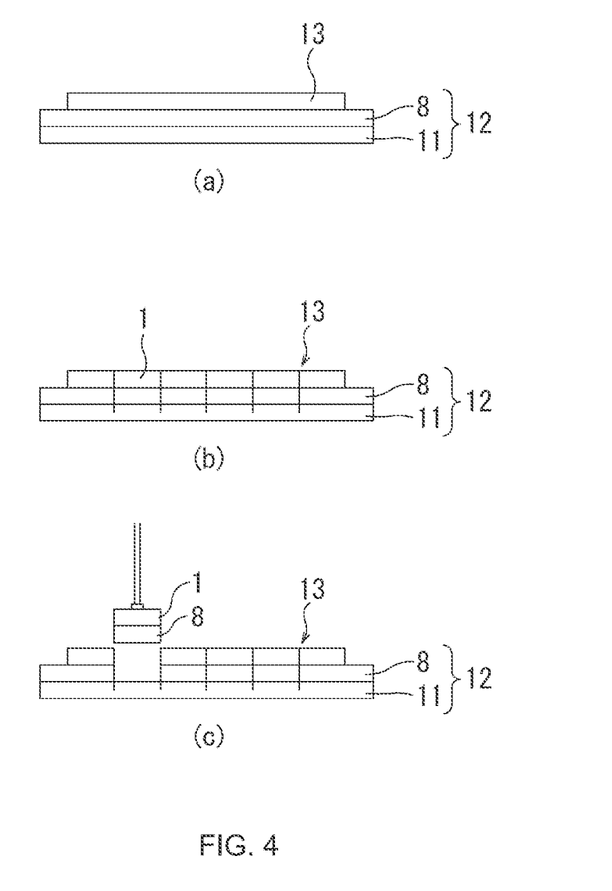
FIG. 4 illustrates a part of a production process of the first package.

In the operation of mounting the circuit element 1 on the metallization wiring 6 through the insulator layer 8, for example, as shown in FIG. 4(a), a laminated tape 12 formed by laminating an insulator layer 8 (insulator film) made of a thermosetting resin with insulating properties, on a UV tape 11 made of a UV-curable resin is prepared, and a wafer 13 as an integral body of a plurality of the circuit elements 1 is placed on the laminated tape 12. Then, the wafer 13 is subjected to dicing to form the plurality of pieces of circuit elements 1. The dicing is performed to allow the UV tape 11 to be half-cut. After completion of the dicing, the UV tape 11 is cured by irradiation with UV, to cause adhesiveness or stickiness thereof to disappear. Then, when one of the circuit elements 1 is picked up, only the insulator layer 8 is left on a rear surface of the circuit element 1, as shown in FIG. 4(c). Subsequently, the circuit element 1 with the insulator layer 8 is mounted on the metallization wiring 6, and then heated under pressing. Consequently, the insulator layer 8 made of a thermosetting resin is melt and hardened, so that the circuit element 1 and the metallization wiring 6 are joined together through the insulator layer 8.

Preferably, a thickness of the insulator layer 8 on the rear surface of the circuit element 1 in a state before the melting/ hardening of the insulator layer 8 is set to be greater than a thickness of the metallization wiring 6, to allow the insulator layer 8 to run into a space between the circuit element 1 and a bottom surface of the first package (e.g., a space S illustrated in FIG. 2) in a course of the melting/hardening, so as to fill the space S with the insulator layer 8. In other words, it is preferable to preliminarily seal such a space S with the insulator layer 8, because the resin mold 10 is less likely to run into the space S.

After the circuit element 1 is mounted (insulatingly joined) on the metallization wiring 6, at least one lead frames 5 is arranged above the metallization wiring 6. Subsequently, the lead frame 5 and the metallization wiring 6 are electrically connected to the circuit element 1 by the wire bonding 9, and then a periphery of the circuit element 1 is molded and sealed by resin. The electrical connection may be achieved using any other suitable electrical connection means, such as flip-chip interconnection.

After the molding/sealing, the base substrate of the transfer lead frame is removed from the resin mold 10 (molded resin) to leave only the metallization wiring 6 of the transfer lead frame on the side of a removing surface of the resin mold 10 in a transferred manner, while allowing the external terminal 6a in a peripheral region of the metallization wiring 6, the island portion 6a in the central region of the metallization wiring 6, and the terminal 6c, to be exposed on the removing surface of the resin mold 10. Then, a portion of the metallization wiring other than the external terminal 6a is masked by a masking layer 7 having insulating properties, in such a manner that only the external terminal 6a is exposed. In this embodiment, at a time when the resin mold 10 is separated from the base substrate, the other end (second end) 5b of the lead frame 5 is also exposed on the removing surface. The end 5b is also masked by the masking layer 7.

In this manner, a portion of the first package other than the external terminal 6a is masked in order to prevent adverse effects caused by short-circuiting between the mounting board and the portion of the metallization wiring other than the external terminal 6a. However, if there is no risk of the short-circuiting, the masking may be omitted.

Meanwhile, the second package 4 is formed to house the piezoelectric vibrator element 3 in a resin mold 14, and hermetically closed by a cover 15. The piezoelectric vibrator element 3 is joined to an external terminal 16 exposed on a lower surface of the second package 4 through a conductive adhesive 17.

This second package 4 is stacked on and fixed to the first package 2, and electrically connected to each other via the external terminals 5a, 16a, to form a piezoelectric oscillator. Then, the package is subjected to trimming on a package-by-package basis (on a piezoelectric oscillator-by-piezoelectric oscillator basis). Alternatively, the second package may be stacked on and fixed to the first package after trimming the first package.

In the above embodiment, the external terminal 6a of the metallization wiring 6 is used as a mounting terminal for mounting the first package on the mounting board, and the external terminal 5a of the lead frame 5 is connected to the external terminal 16 of the second package 4. Alternatively, the lead structure may be conversely changed such that the external terminal 5a of the lead frame 5 is used as the mounting terminal for mounting the first package on the mounting board, and the external terminal 6a of the metallization wiring 6 is connected to the external terminal 16 of the second package 4. Further, the terminal 6c of the metallization wiring 6 may be used as the mounting terminal.

Figure 5:
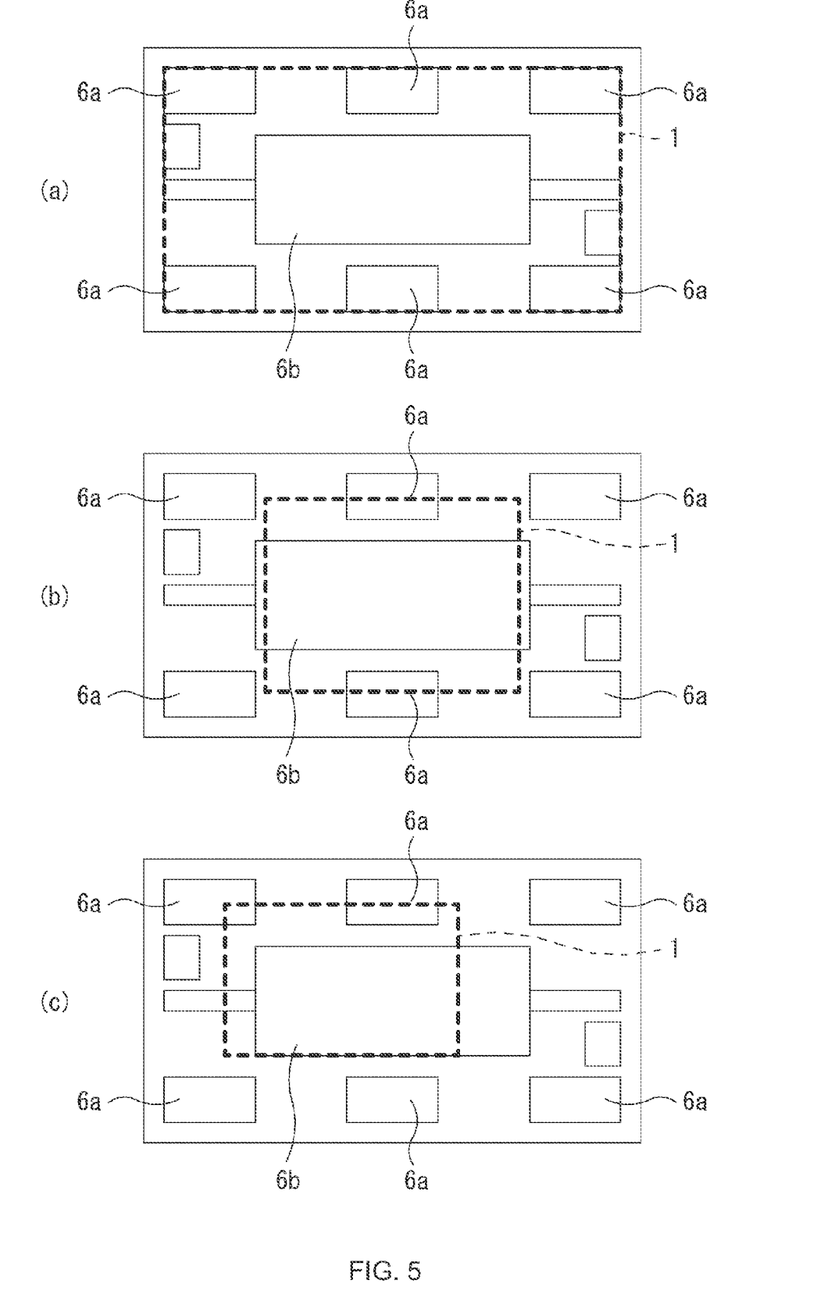
FIG. 5 illustrates an example of mounting of a circuit element (first element) in the present invention.

In the above embodiment, the circuit element 1 is mounted on the external terminal 6a of the metallization wiring 6 in partially overlapped relation therewith. Alternatively, in cases where the circuit element 1 has a relatively large size, it may be mounted on the external terminal 6a in overlapped relation with the entire surface thereof, as shown in FIG. 5(a). In this case, the electrical connection between the circuit element 1 and the external terminal 6a may be established by a through-hole or the like. Differently, in cases where the circuit element 1 has a relatively large size, it may be mounted on a part of the six areas of the external terminal 6a, in partially overlapped relation therewith, as shown in FIGS. 5(b) and 5(c). Further, the circuit element 1 may be mounted on the island portion 6a in partially overlapped relation therewith, instead of the overlapped relation with the entire surface thereof. In essence, in the present invention, the circuit element 1 is mounted on the external terminal 6a in at least partially overlapped relation therewith and on the island portion 6b in at least partially overlapped relation therewith.

Although the above embodiment has been described based on a piezoelectric oscillator, the package structure of the present invention is not limited to the piezoelectric oscillator.

BRIEF DESCRIPTION OF THE DRAWINGS

FIG. 3 is a perspective view of a first package in FIG. 1, wherein FIG. 3(a), FIG. 3(b) and FIG. 3(c) illustrate a portion on the side of a second package, a portion on the side of a mounting surface and an internal structure, respectively.

EXPLANATION OF CODES

1: circuit element (first element)
2: first package
3: piezoelectric vibrator element (second element)
4: second package
5: lead frame
5a: external terminal
5b: second end
6: metallization wiring
6a: external terminal
6b: island portion
6c: terminal
7: masking layer
8: insulator layer
9: wire bonding
10: resin mold
11: UV tape
12: laminated tape
13: wafer
14: resin mold
15: cover
16: external terminal
17: conductive adhesive

What is claimed is:

1. A semiconductor device comprising a first package embedding a first element, and a second package stacked on and fixed to the first package while internally housing a second element, wherein the first package includes a lead frame and a metallization wiring, and wherein:
   a certain end of the lead frame is formed as a first external terminal exposed in flush relation with an outer surface of the first package; and
   metallization wiring resin molded within the first package and including a transfer lead frame having a portion on a surface of molded resin, and having a peripheral region exposed on the side of and in flush relation with the molded resin so as to serve as a second external terminal,
   the first element including an insulting layer, the first element mounted on the second external terminal of the metallization wiring in at least partially overlapped relation therewith, separated from the second external terminal by the insulator layer, the first element electrically connected to the lead frame and the metallization wiring; and
   one of the first and second external terminals is exposed on one of upper and lower surfaces of the first package to serve as a mounting terminal, and a remaining one of the first and second external terminals is exposed on a remaining one of the upper and lower surfaces and electrically connected to an external terminal of the second package.

2. The semiconductor device as defined in claim 1, wherein the metallization wiring of the transfer lead frame has an island portion in a central region thereof, and wherein the first element is mounted on the second external terminal of the metallization wiring in at least partially overlapped relation therewith and on the island portion in at least partially overlapped relation therewith, electrically insulated from the island by the insulator layer.

3. The semiconductor device as defined in claim 2, wherein the island portion is provided with a terminal electrically connected to the first element and/or the lead frame.

4. The semiconductor device as defined in claim 1, which is adapted to be used as a piezoelectric oscillator, wherein the first element is a circuit element for making up an oscillator circuit, and the second element is a piezoelectric vibrator element.

5. A communication apparatus comprising the semiconductor device as defined in claim 1.

6. An electronic apparatus comprising the semiconductor device as defined in claim 1.

7. The semiconductor device as defined in claim 2, which is adapted to be used as a piezoelectric oscillator, wherein the first element is a circuit element for making up an oscillator circuit, and the second element is a piezoelectric vibrator element.

8. A communication apparatus comprising the semiconductor device as defined in claim 2.

9. An electronic apparatus comprising the semiconductor device as defined in claim 2.

10. A semiconductor device comprising:
   a first package including
      a first circuit element embedded in the first package,
      an insulation layer affixed to the first circuit element,
      a metallization wiring including at least one second external terminal exposed at a lower surface of the first package, the first circuit element mountable to the metallization wiring and insulated therefrom by the insulation layer, the mounted first circuit element electrically connectable to the metallization wiring by a wire bonding, and
      at least one lead frame arranged above the metallization wiring and including at least one first external terminal exposed at an upper surface of the first package, the at least one first external terminal and the at least one second external terminal electrically connected;
   and
   a second package including
      at least one second circuit element internally housed in the second package,
      at least one external terminal exposed at a lower surface of the second package and electrically connected to the at least one second circuit element,
   wherein when the first and second packages are stacked one upon the other, the at least one first external terminal of the first package is electrically connected to the at least one external terminal of the stacked second package.

11. The device as defined in claim 10, wherein the mounted first circuit element at least partially overlaps the at least one second external terminal, the affixed insulating layer operative to maintain an insulating separation between the mounted first circuit element and the at least partially overlapped at least one second external terminal.

12. The device as defined in claim 10, wherein the first circuit element further includes a plurality of second external terminals, each second external terminal separated to form a space between adjacent second external terminals, and
   wherein the mounted first circuit element at least partially overlaps at least one of the plurality of second external terminals.

13. The device as defined in claim 12, wherein the affixed insulating layer and first circuit element are mounted to the metallization wiring through heat treatment, the insulating layer positionable over the space between adjacent second terminals in order to expand into the space during heat treatment.

14. The device as defined in claim 13, wherein the thickness of the insulating layer, prior to heat treatment, is greater than the thickness of the metallization wiring.

15. The device as defined in claim 10, wherein the second circuit element is a piezoelectric vibrator element.

16. The device as defined in claim 10, the metallization wiring of the first package further including at least one additional terminal, the mounted first circuit element electrically connected to the at least one additional terminal by a wire bonding, the at least one additional terminal electrically connected to the at least one lead frame by a metal wiring.

17. The device as defined in claim 16, the first package further including a masking layer covering a portion of the metallization wiring at the lower surface of the first package except for the exposed at least one second external terminal.

18. A method of manufacturing a semiconductor device comprising the steps of:
   manufacturing a first circuit element, including the steps of
      affixing a first circuit element to an insulating layer,
      mounting the insulating layer on a metallization wiring thereby insulatingly joining the first circuit element and the metallization wiring, the metallization wiring including at least one second external terminal exposed at a lower surface of the first package, the mounted first circuit element at least partially overlapping the at least one second external terminal,
      arranging at least one lead frame above the metallization wiring, the at least one lead frame including at least one first external terminal exposed at an upper surface of the first package;
   electrically connecting the at least one lead frame and the metallization wiring to the first circuit element; and
   stacking a second package on the manufactured first package, the second package including at least one second circuit element electrically connected to at least one external terminal exposed at a lower surface of the second package,
wherein the stacking thereby electrically connects the at least one external terminal of the second package to the at least one first external terminal of the first package.

19. The method according to claim 18, the affixing further including
 forming a laminated tape by laminating the insulator layer on a UV tape made from a UV-curable adhesive or resin,
 placing a wafer on the laminated tape, the wafer being an integral body of a plurality of first circuit elements,
 dicing the wafer and laminated tape, each diced portion defining a first circuit element affixed to an insulating layer, and an insulating layer affixed to the UV tape,
 curing the UV tape to remove the adhesive or resin, and
 removing the affixed first circuit element and insulating layer from the UV tape.

20. The method according to claim 19, wherein the mounting includes heat pressing the affixed first circuit element and insulating layer to the metallization layer, and
 wherein the insulating layer is formed from a thermosetting resin, and the mounting further includes heat pressing the first circuit element, the metallization wiring, and the insulator layer thereby melting the insulating layer and joining the first circuit element, the metallization wiring, and the insulator layer.

* * * * *

UNITED STATES PATENT AND TRADEMARK OFFICE
CERTIFICATE OF CORRECTION

PATENT NO. : 8,384,202 B2 Page 1 of 1
APPLICATION NO. : 12/920632
DATED : February 26, 2013
INVENTOR(S) : Hoashi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 229 days.

Signed and Sealed this
First Day of September, 2015

Michelle K. Lee
*Director of the United States Patent and Trademark Office*